United States Patent
Shih et al.

(10) Patent No.: US 7,638,004 B1
(45) Date of Patent: Dec. 29, 2009

(54) METHOD FOR CLEANING MICROWAVE APPLICATOR TUBE

(75) Inventors: Hong Shih, Walnut, CA (US); Harmeet Singh, Fremont, CA (US); Raphael Casaes, Oakland, CA (US); Duane Outka, Fremont, CA (US); Mohammad Kamarehi, Gaithersburg, MD (US)

(73) Assignee: Lam Research Corporation, Fremont, CA (US)

( * ) Notice: Subject to any disclaimer, the term of this patent is extended or adjusted under 35 U.S.C. 154(b) by 314 days.

(21) Appl. No.: 11/445,487

(22) Filed: May 31, 2006

(51) Int. Cl.
*B08B 3/04* (2006.01)
(52) U.S. Cl. .............. 134/26; 134/1; 134/1.1; 134/1.2; 134/1.3; 134/2; 134/3; 134/27; 134/28; 134/29; 134/30; 134/34; 134/35; 134/36; 134/40
(58) Field of Classification Search ............ 134/1, 134/1.1, 1.2, 1.3, 2, 3, 26, 27, 28, 29, 30, 134/34, 35, 36, 40, 41, 42, 902; 510/175
See application file for complete search history.

(56) References Cited

U.S. PATENT DOCUMENTS

| | | | | |
|---|---|---|---|---|
| 3,715,047 A | * | 2/1973 | Sado | 215/261 |
| 5,355,048 A | * | 10/1994 | Estes | 310/334 |
| 5,961,851 A | * | 10/1999 | Kamarehi et al. | 216/69 |
| 6,660,134 B1 | * | 12/2003 | Gopalraja et al. | 204/192.12 |
| 6,810,887 B2 | * | 11/2004 | Tan | 134/1.3 |
| 7,247,579 B2 | * | 7/2007 | Ren et al. | 438/753 |
| 2002/0134513 A1 | * | 9/2002 | Palagashvili et al. | 156/345.52 |
| 2002/0166574 A1 | * | 11/2002 | Lee | 134/8 |
| 2003/0190870 A1 | * | 10/2003 | Shih et al. | 451/39 |
| 2004/0231706 A1 | * | 11/2004 | Bhatnagar et al. | 134/28 |
| 2005/0274396 A1 | * | 12/2005 | Shih et al. | 134/29 |
| 2007/0012658 A1 | * | 1/2007 | Mize | 216/52 |
| 2007/0051699 A1 | * | 3/2007 | Kiehlbauch et al. | 216/67 |
| 2008/0066785 A1 | * | 3/2008 | Vesci et al. | 134/22.1 |

FOREIGN PATENT DOCUMENTS

WO   WO2005/123282 A2   *   12/2005

* cited by examiner

*Primary Examiner*—Sharidan Carrillo
(74) *Attorney, Agent, or Firm*—Beyer Law Group LLP (57) ABSTRACT

A method of cleaning a microwave plasma applicator tube as described herein includes preparing a microwave plasma applicator for cleaning. A general cleaning of the plasma applicator tube is performed using an organic solvent wash and an ultrapure water wash. Selective cleanings of the tube are performed to remove selected contaminants. Such cleanings include a third wash with an alkaline cleaning solution, a fourth wash with an acidic cleaning solution and another wash using an ammonia and peroxide solution. The tube is rinsed using a sonicating wash performed in ultrapure water followed by drying. Also, the coil can be cleaned using acidic wash solution.

28 Claims, 4 Drawing Sheets

METHOD FOR CLEANING MICROWAVE APPLICATOR TUBE

TECHNICAL FIELD

The invention described herein relates generally to method for cleaning. In particular, the invention relates to methods for cleaning of applicator tubes used in photoresist removal applications.

BACKGROUND

Semiconductor micro-circuitry is formed on substrates using a widely varied number of fabrication processes. One part of such fabrication processes frequently includes the photolithographic patterning of surfaces to generate the desired structural patterns on a semiconductor substrate surface. As is known to those having ordinary skill in the art such photolithographic patterning generally involves image transfer from a mask pattern onto the substrate surface.

Commonly, this means that layer of material known as photoresist is coated onto the top layers of a substrate. Both positive and negative photo resists are used as process circumstances are required. A mask pattern is then commonly used to controllably expose various parts of the photoresist to an exposing light beam. The photoresist is developed to reveal a desired transfer pattern in photoresist. Subsequent processing can be used to etch away the exposed surfaces of the substrate to achieve a transfer of the pattern into the substrate.

After patterning the photoresist is removed. Commonly, the photo resist is removed in a process chamber referred to as a strip module. Typically, a photoresist stripping process takes about 5 minutes. This presents a significant processing bottleneck as such stripping takes significantly longer than most of the other associated process steps. Once tools for stripping photoresist become fouled by process detritus, their stripping efficiencies can deteriorate rapidly. In some cases the deterioration is so marked as to double (or more) the stripping process times. This makes an existing process bottleneck significantly worse. The present invention is intended to address some aspects of this problem.

Figure 1:
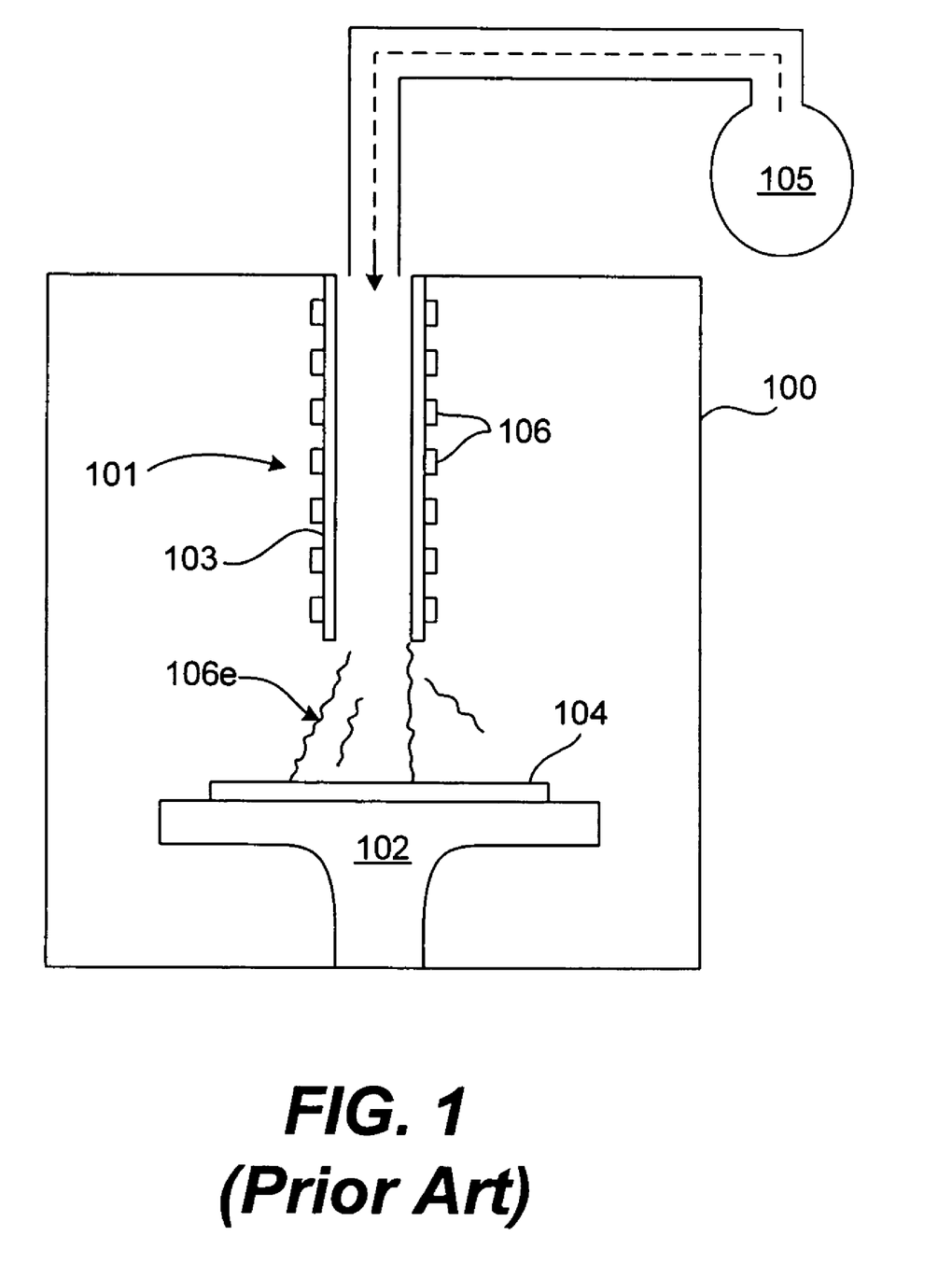
FIG. 1 is a simplified depiction of a prior art photoresist stripping chamber showing a microwave plasma applicator assembly operating therein.

FIG. 1 schematically depicts a simplified schematic view of an ordinary photoresist stripping tool and is accompanied by the following brief description of its operation. One example of such a tool is a Conductor Etch 2300 MWS strip module produced by Lam Research Corporation of Fremont, Calif. The schematically depicted tool is shown in cross-section view. An example strip chamber 100 includes a pedestal 102 that holds the substrate 104 (commonly, a semiconductor wafer) having photoresist material formed thereon. The microwave strip chemistry applicator assembly 101 is positioned in the chamber 100. The applicator assembly 101 typically comprises an application tube 103 positioned inside a RF coil 106. Strip gasses 105 are flowed into the application tube 103. In one typical application, the strip gases can include, $O_2$, $N_2$, $H_2O$, $CF_4$, or other suitable materials. As the gasses are flowed through the application tube 103 the coil 106 is energized. The electric field created by the coil is sufficient to ionize the strip gases. The ionized strip gases pass out of the tube 103 as effluent plasma 106e which strips the photoresist from the substrate 104.

Over time, the effluent and the residue generated by the stripped photoresist coat the chamber walls and deposit on the inside of the walls of the tube 103. The unfortunate effect of this process is that the accumulated residue changes the strip rate of the stripping process. As an unfortunate consequence, the strip times can be doubled or more in a matter of months due to the accumulation of undesirable residues on the inner tube walls. Previously, the solutions have been to supply a new application tube once the process degradation has become too great. This is an expensive solution and can take the strip chamber out of commission while a new tube is being shipped and installed. Thus, it would be preferable to develop suitable cleaning process that would enable the application tube to be returned to use in relatively short order without the need to replace the tube every three months.

For these and other reasons, an effective microwave applicator tube cleaning process is needed.

SUMMARY OF THE INVENTION

In accordance with the principles of the present invention, microwave applicator tube cleaning methodologies are disclosed.

In one embodiment, a method of cleaning a microwave plasma applicator tube is disclosed. The method begins by preparing a microwave plasma applicator for cleaning. A general cleaning of the plasma applicator tube is performed. Also, a set of selective cleanings of the tube is performed. These selective cleanings include a fourth wash with an alkaline cleaning solution to remove $AlF_x$ contaminants from the tube. And also a fifth wash with an acidic cleaning solution to remove contaminants from the tube.

In another embodiment, the method includes the following operations. Preparing a microwave applicator for cleaning by providing an applicator having a sapphire microwave applicator tube encased in a copper RF coil and removing the sapphire microwave applicator tube from the encasing copper RF coil. A first wash to remove organic contaminants from the tube is performed using a wash solution containing an organic solvent. A second wash is performed with ultrapure water to remove water soluble contaminants from the tube. One such suitable solvent can be isopropyl alcohol. A third wash using an ammonia and peroxide containing solution can be performed to remove contaminants from the tube. A fourth wash is performed using an alkaline cleaning solution. In one embodiment the alkaline cleaning solution can comprise a tetramethyl ammonium hydroxide solution. A fifth wash is performed with the acidic cleaning solution. The acidic solution can be a solution of HF (hydrofluoric acid), $HNO_3$ (nitric acid), $H_2O$ (water). The tube can be rinsed using a sonicating wash performed in ultrapure water. Also, the coil can be cleaned using acidic wash solution. The cleaned tube can then be dried.

These and other aspects of the present invention are described in greater detail in the detailed description of the drawings set forth hereinbelow.

BRIEF DESCRIPTION OF THE DRAWINGS

The following detailed description will be more readily understood in conjunction with the accompanying drawings, in which.

DETAILED DESCRIPTION OF THE DRAWINGS

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description describes various embodiments of cleaning microwave applicator tubes in accordance with the principles of the invention.

Aspects of the invention include methodologies used for adequately cleaning a microwave plasma applicator tube to restore its functionality after use has degraded its efficiency. The process generally includes a series of washes designed to remove general contamination from the tube and also to remove residues deposited on the tube during photoresist stripping processes. In particular, the methods described herein enable the removal of $TiF_x$ and photoresist residues.

A first set of generalized washes with water and organic solvents is used to remove the gross contamination from the tube. A peroxide/ammonia wash is used to remove titanium fluoride ($TiF_x$) residues. An alkaline wash (e.g., a tetra methyl ammonium hydroxide solution) is used to remove aluminum fluoride ($AlF_x$) residues. An acidic wash (e.g., an $HF:HNO_3:H_2O$ solution) is used to remove metal and silicon (among others) residues. The tube is then final rinsed (e.g., in a sonication bath). Also, the coil can be cleaned using an acid treatment (e.g., hydrochloric acid). The following description of the drawings will, using the illustrated examples, more clearly explain many aspects of the invention.

Figure 2:
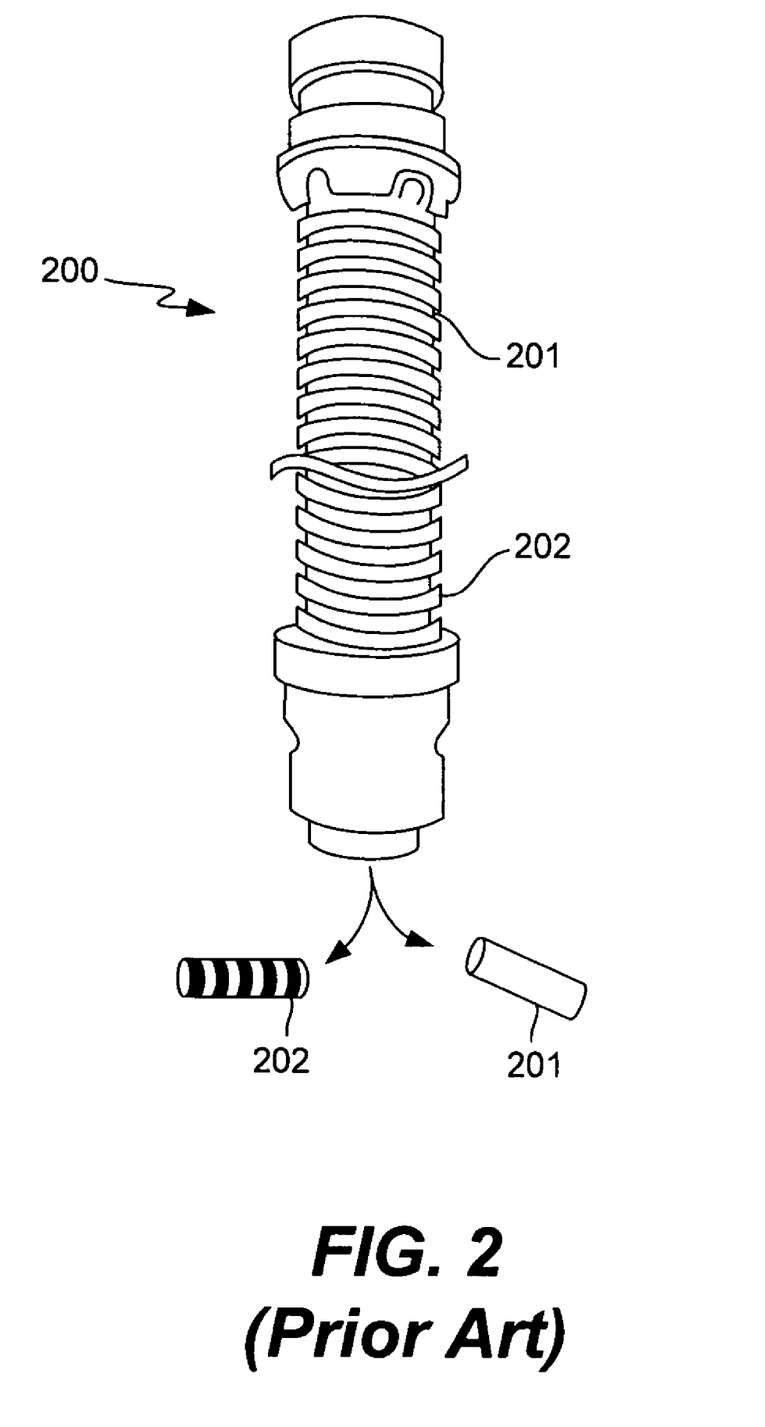
FIG. 2 is a simplified perspective view of a prior art microwave plasma applicator, the RF coil and the plasma application tube.

FIG. 2 depicts a simplified microwave plasma applicator 200 that includes application tube 201 and associated RF coil 202. In the depicted embodiment, the application tube 201 comprises a sapphire application tube. Also, the coil 202 comprises a copper or copper alloy water-cooled coil. In one embodiment, the assembly comprises an assembly used in a Conductor Etch 2300 MWS strip module produced by Lam Research Corporation. The inventors fully contemplate that the processes disclosed here can be employed using a number of plasma application tubes and coils and are not specifically limited to the exact examples shown here.

FIG. 2 schematically depicts an embodiment where the coil 202 is separated from the tube 201 which can form one part of a cleaning process in accordance with the principles of the invention. This process has the advantage of enabling a through cleaning of the tube 201 without worrying whether the coil 202 will be damaged by the cleaning process. Alternative processes will be described herein that do not require the disassembly of the tube/coil applicator. This has the advantage of such a simplified disassembly process in that it does not require extensive disassembly and reassembly.

Figure 3:
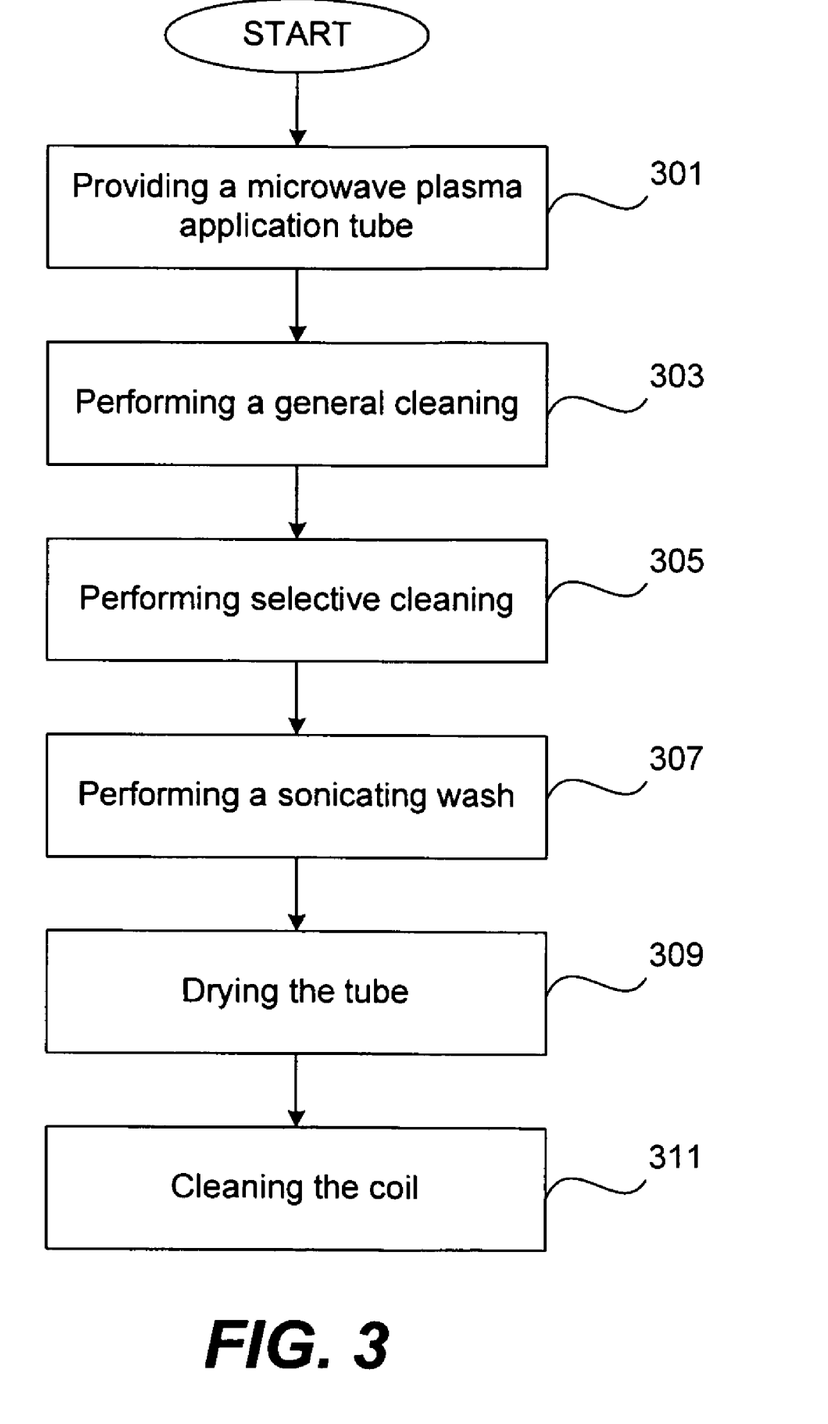
FIGS. 3-5 are a set of associated flow diagrams depicting aspects of a method embodiment in accordance with the principles of the present invention.

FIG. 3 is a flow diagram illustrating one general cleaning implementation of the invention. A microwave plasma applicator is provided (Step 301). This applicator is subjected to a general cleaning (Step 303). Selective cleaning is then applied to the applicator to remove particular contaminants (Step 305). A sonicating wash is performed (Step 307) and the applicator is dried (Step 309). The coil is then cleaned (Step 311).

With reference to FIG. 3, the reader is referred to the operation of providing an applicator tube. Commonly, the applicator is provided with the tube and coil disassembled. However, the tube can be provided with the tube and coil assembled. The same general process is also performed in embodiments where the coil remains assembled with the tube. Generally, in such cases the coil will be masked to prevent excessive exposure to the corrosive cleaning solutions described herein. Such applications will be discussed elsewhere in the application.

In the event of a cleaning a tube without the coil the general cleaning 303 is performed. This can be performed as indicated in the simplified flow diagram of FIG. 4 which includes a first, second, and a third wash (401, 403, 405) respectively. In one embodiment the disassembly is performed in a Class 1000 or better clean room. Additionally, the following cleaning steps should also be performed in a like clean room.

Figure 4:
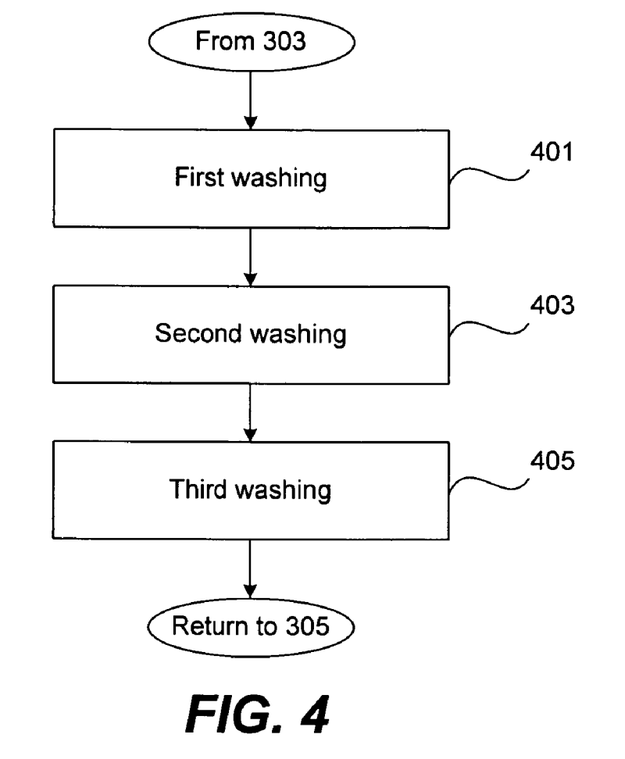

The first wash (Step 401) is commonly used to remove materials soluble in organic solvents from the tube. The removal of organic contaminants from the tube is commonly achieved by washing the tube in a suitable organic solvent. Suitable example organic solvents include, but are not limited to, isopropyl alcohol, acetone, methyl ethyl ketone, and the like. This cleaning step is frequently useful in removing organic and human contaminant residues.

In one example, the tube can be soaked in isopropyl alcohol for about 10-25 minutes. In one implementation the isopropyl alcohol (IPA) is 100% (IPA) conforming to SEMI Spec C41-1101A, Grade 2 or better. The solvent is then wiped dry. In one implementation such wiping achieved using a Teflon rod and cleanroom grade knitted polyester wipes. The tube is then rinsed using ultrapure water (UPW) having a resistivity greater than about 16 Mega-ohm/cm ($M\Omega/cm$) or better. For example, 18 $M\Omega/cm$ UPW can also be used. A rinse of at least about two (2) minutes should be adequate. As indicated above, these actions can be performed in a Class 1000 or better clean room. It is pointed out that in some embodiments a desired wash can be achieved by confining the wash solution inside of the tube by sealing the ends of the tube and filling the tube with the organic solvent to execute the wash process. In this way only the interior of the tube need be cleaned. For example, silicon rubber seals can be applied to the tube to seal the cleaning solution. Alternatively, the entire tube can be immersed in a suitable cleaning bath.

Also, it should be noted that the materials, temperatures, wash times, and other applied details described herein are merely examples of satisfactory implementations as applied to a much broader process in accordance with the principles of the invention.

Additionally, a second wash is performed (Step 403) to remove water soluble contaminants or deposits. Typically, the wash is performed using ultrapure water to remove water soluble contaminants. Again ultrapure water (UPW) here has a resistivity greater than about 16 Mega-ohm/cm ($M\Omega/cm$) or better (18 $M\Omega/cm$ UPW being suitable). As indicated above, these actions can be performed in a Class 1000 or better clean room.

In one example process hot UPW is used to soak the applicator tube for at least about five (5) minutes. Hot UPW temperatures in excess of about 50 degrees centigrade (° C.) are suitable for most implementations. In one example, the tube is soaked in 80° C. water for in the range of about 15-20 minutes. Subsequently the tube is wiped (again for example, using a Teflon rod and cleanroom grade wipes). The tube is then rinsed using ultrapure water (UPW) as described above.

A rinse for at least two (2) minutes should be adequate. As indicated above, these actions can be performed in a Class 1000 or better clean room.

It is pointed out that in some embodiments a desired UPW wash can be achieved by confining the wash solution inside of the tube by sealing the ends of the tube and filling the tube with the ultrapure water to execute the wash process. In this way only the interior of the tube need be cleaned. For example, silicon rubber seals can be applied to the tube to seal the cleaning solution. Alternatively, the entire tube can be immersed in a suitable cleaning bath.

It should be noted that the materials, temperatures, wash times, and other details described herein are merely one example of a satisfactory implementation as applied to a much broader process in accordance with the principles of the invention.

With reference to FIG. 4, a third wash with an ammonia peroxide solution (Step 405) is performed to remove contaminants from the tube. Such solutions are effective at removing $TiF_x$ contaminants from the tube. Additionally, this solution is effective for removing metal ions, photoresisist residues, and organic depositions from the tube. In one embodiment, the wash solution contains hydrogen peroxide and ammonium hydroxide.

In one example, the solution contains hydrogen peroxide ($H_2O_2$) and ammonium hydroxide ($NH_4OH$) solutions diluted into an aqueous ($H_2O$) solution having a solution ratio of $H_2O_2:NH_4OH:H_2O$ of about 1:1:2. One example solution can be made using 30% weight/volume (w/v) solution of aqueous hydrogen peroxide ($H_2O_2$), 29% w/v aqueous ammonium hydroxide ($NH_4OH$), mixed with ultrapure water. For example, a mixture of 250 ml of the $H_2O_2$ solution and 250 ml of the $NH_4OH$ solution in 500 ml of ultrapure water will satisfy the 1:1:2 ratio. Of course, other ratios and solution concentrations can be employed to obtain a suitable cleaning solution.

The tube can be soaked in this solution or alternatively, the tube can be stoppered with silicon rubber plugs and filled with the peroxide ammonia solution. In a typical implementation the tube should be washed for at least about 20 minutes. In one example implementation the tube is soaked for about thirty (30) minutes in three separate soaks of about ten minutes each. After each ten minute soak, the solution is disposed of and replaced with a fresh solution for additional soaking.

Suitable component solutions include, for example, semiconductor grade hydrogen peroxide conforming to SEMI Spec C30-1101, Grade 2 or better, semiconductor grade ammonium hydroxide conforming to SEMI Spec C21-0301, Grade 2, and ultrapure water of a type previously described.

After treatment with the peroxide/ammonia solution, the tube is then rinsed using ultrapure water (again, for example having a resistivity greater than about 16 MΩ/cm). A rinse of at least about two (2) minutes should be adequate.

The tube is then dried using Clean Dry Air or alternatively filtered $N_2$ (for example, filtered with a 0.05 to 0.1 μm (micrometer) filter). As indicated above, these actions can be performed in a Class 1000 or better clean room.

The inventors point out that by confining the above-described ammonia peroxide solution to the inside of the tube by sealing the ends of the tube and filling the tube with the solution, only the interior of the tube need be cleaned. This is particularly helpful due to the corrosive nature of the solution. Alternatively, in another approach, the entire tube can be immersed in a suitable cleaning bath. However, in situations where the full applicator is cleaned without disassembly and full immersion is employed, the coil should be masked to prevent exposure to the solution. It is also pointed out that the foregoing wash steps are explained in order for ease of description. The invention is more flexible in practice and the foregoing wash steps may be performed in different orders.

It should be noted that the materials, temperatures, wash times, and other details described herein are merely examples of a satisfactory implementation as applied to a much broader process in accordance with the principles of the invention.

Figure 5:
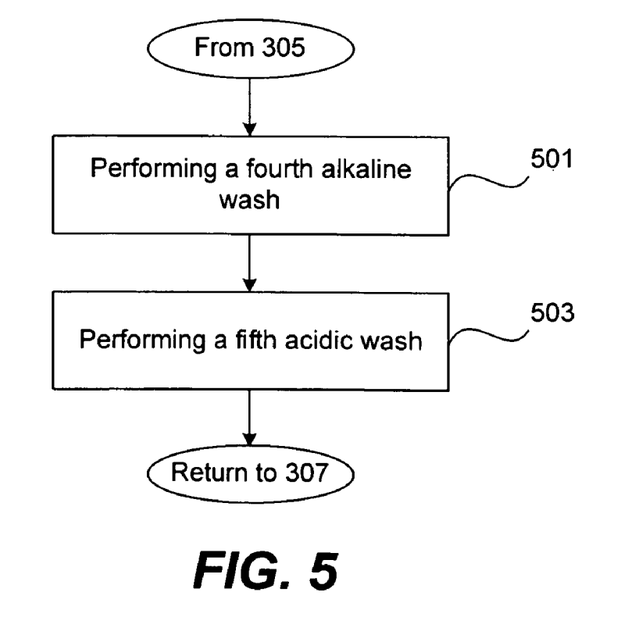

With reference to FIGS. 3 and 5, selective cleaning of the tube is performed (Step 305). The wash operations are disclosed in a specific order. However, the inventors contemplate that the wash operations can be performed in any order the cleaner deems expedient.

In any case, as indicated in FIG. 5, a fourth alkaline wash (Step 501) is performed. This fourth wash includes an alkaline cleaning solution suitable for removing $AlF_x$ contaminants and deposits from the tube. In particular the solution should be suitable for removing $AlF_3$ contamination from the tube.

The fourth wash can be achieved by washing the tube in a tetramethyl ammonium hydroxide (TMAH) solution. This cleaning step is useful in removing $AlF_x$ contaminants. Due to the difficulty in removing $AlF_x$ contaminants several treatments with the fourth wash may be necessary. Additionally, the effectiveness of the solutions is enhanced if fresh TMAH solutions are used each time these fourth wash are repeated.

In one example, the tube can be soaked in a TMAH solution or alternatively, the tube can be stoppered with silicon rubber plugs and filled with TMAH solution. Such cleaning can be performed, for example, for at least about 30 minutes. Where the application tube has been used extensively a treatment (wash) time of at least two (2) hours is commonly required. It is not uncommon for wash cycles of eight (8) hours or more to be employed. In such a case numerous refills with fresh wash solution can be employed. One example of a suitable fourth wash solution is TMAH solution in concentrations of about 2.5-10.0% (w/v) of TMAH. For example, CC238S non-ionic developer available from Cyantek Corporation of Fremont, Calif. can be used to make the solution. In one particular implementation, a solution of about 5.0% (w/v) TMAH is prepared and heated to at least about 80° C. for tube washing. The application tube can be periodically checked for the progress of the contamination removal. In one implementation, the tube can be washed repeatedly until rainbow colored contamination is gone from the tube. The tube is then rinsed using ultrapure water (UPW) having a resistivity greater than about 16 Mega-ohm/cm (MΩ/cm) or better. For example, 18 MΩ/cm UPW can also be used. A rinse of at least about two (2) minutes should be adequate. In one implementation a five (5) minute rinse is used. The tube is then dried using Clean Dry Air (CDA) or alternatively filtered $N_2$ (for example, filtered with a 0.05 to 0.1 μm (micrometer) filter). As indicated above, these actions can be performed in a Class 1000 or better clean room.

It is pointed out that in some embodiments a desired TMAH wash can be achieved by confining the TMAH solution inside of the tube by sealing the ends of the tube and filling the tube with the TMAH solution to execute the wash process. In this way only the interior of the tube need be cleaned. This is particularly helpful due to the corrosive nature of the solution. In one example, silicon rubber seals can be applied to the tube to seal the cleaning solution. Alternatively, in another approach, the entire tube can be immersed in a suitable cleaning bath. In situations where the full applicator is cleaned without disassembly and full immersion is employed, the coil should be masked to prevent exposure to the TMAH solution.

It should be noted that the materials, temperatures, wash times, and other process details described herein are merely examples of a satisfactory implementation as applied to a much broader process in accordance with the principles of the invention.

Referring again to FIG. 5, a fifth wash with an acidic cleaning solution (Step 503) is performed to remove contaminants from the tube. In some embodiments, such an acidic wash is effective for removing silicon and silicon oxide residues from the tube. Such acid washes are also useful for removing selected metal deposits from the tube, such deposits include but are not limited to Al, Ca, Mg, Ti, Cr, Ni, Li, Na, K, Zn, Mo, Mn, and Fe. A suitable wash solution also facilitates the removal of $Al_xF_yO_z$ residues.

In one embodiment, the fifth wash can be achieved by washing the tube in an acidic solution containing hydrofluoric acid and nitric acid. This cleaning solution is generally useful in removing all of the aforementioned contaminants.

In one example, the acidic solution contains hydrofluoric acid (HF) and nitric acid ($HNO_3$) in an aqueous solution in a ratio of $HF:HNO_3:H_2O$ of about 1:1:10. Such solution can be made using 49% weight/volume (w/v) solution of aqueous hydrogen fluorine (HF), 69% w/v aqueous nitric acid ($HNO_3$), mixed with ultrapure water. For example, a mixture of 83 ml of HF solution and 83 ml of $HNO_3$ solution in 834 ml of ultrapure water will satisfy the 1:1:10 ratio.

The tube can be soaked in the acidic solution bath or alternatively, the tube can be stoppered with silicon rubber plugs and filled with acidic solution for cleaning. Such washing should proceed for at least about 10 minutes. In one implementation, for example, a new applicator tube can be soaked in the acidic solution for about 15 minutes. A used applicator typically requires a longer soak time to be effective. In one example, a wash time for a used applicator is on the order of about 30 minutes. Suitable component solutions include, for example, semiconductor grade hydrogen fluorine conforming to SEMI Spec C28-0301, Grade 2 or better, semiconductor grade nitric acid conforming to SEMI Spec C35-0301, Grade 2, and ultrapure water of a type previously described. In most applications the wash is generally performed with the acidic solution at a temperature greater than about 25° C. In one particular implementation the wash is performed in a solution maintained in the range of about 80-90° C. The tube is then rinsed using ultrapure water (again, for example having a resistivity greater than about 16 MΩ/cm). A rinse of at least about ten (10) minutes should be adequate. As indicated above, these actions can be performed in a Class 1000 or better clean room.

The inventors point out that by confining the acidic solution inside of the tube by sealing the ends of the tube and filling the tube with the acidic solution only the interior of the tube need be cleaned. This is particularly helpful due to the corrosive nature of the solution. Alternatively, in another approach, the entire tube can be immersed in a suitable cleaning bath. However, in situations where the full applicator is cleaned without disassembly and full immersion is employed, the coil should be masked to prevent exposure to the acid solution.

It should be noted that the materials, temperatures, wash times, and other details described herein are merely examples of satisfactory implementations as applied to a much broader process in accordance with the principles of the invention. The inventors point out that all the foregoing wash steps are explained in order to facilitate description. In practice, the actual wash order (of operations 401, 403, 405, 501, 503) is somewhat more flexible and can be performed in other orders.

Additionally, after cleaning, the tube is immersed in a sonication bath (Step 307) for ultrasonic cleaning. In one embodiment, an ultrasonic tank having a power density of greater than 10 Watts per square inch ($W/in^2$) is used in an ultrapure water bath to conduct a final cleaning. In one embodiment a 40 KHz tank having a power density in the range of about 10-20 $W/in^2$ is satisfactory. The ultra sonic cleaning can be operated at other frequencies (e.g., a 26 KHz tank). In a typical example process, an ultra sonic cleaner is placed in a class 100 clean room and prepared for use. The tube is rinsed with UPW and then placed in the ultra sonic cleaner. The tube is ultrasonically cleansed for at least five (5) minutes in 25° C. ultrapure water. The tube is then removed from the ultrasonic cleaner and can be rinsed again with UPW for at least two minutes.

This is followed by the operation of drying the tube (Step 309). This can also be accomplished in a Class 100 clean room. In one embodiment, the tube is treated with clean dry air of filtered nitrogen as described above. Once the tube is dry it is then placed in an oven for final drying. This can be achieved, for example, by heating the tube to at least 110° C. for at least one (1) hour to dry the tube. Longer hotter drying can of course be used. The tube is then typically inspected for damage and then double sealed inside a pair of Class 100 clean room bags for return to the end user.

Additionally, in this embodiment, the coil can be cleaned (Step 311) separately if desired. Such cleaning is easily accomplished using an acid wash. One suitable wash is accomplished by soaking the coil in a dilute hydrochloric acid solution for 5-20 seconds. This brief wash is generally sufficient to clean the coil. Further cleanings may be employed if desired. The coil is then rinsed with UPW for about five minutes and then dried with CDA or filtered nitrogen as described above.

One suitable acid solution contains hydrogen chloride (HCl) in an aqueous ($H_2O$) solution in a ratio of HCl solution:$H_2O$ of about 1:30. Such solution can be made using 37% w/v solution of aqueous HCl mixed with ultrapure water. For example, a mixture of 32 ml of the HCl solution in 968 ml of ultrapure water will satisfy the 1:30 ratio.

Suitable component solutions include, for example, semiconductor grade hydrochloric acid conforming to SEMI Spec C28-0301, Grade 2 or better and ultrapure water of a type previously described.

Alternatively, the coil cleaning can be performed using other acidic solutions if desired. In one example alternative approach, an aqueous $HNO_3$ solution of about 0.2-0.5% $HNO_3$ can be used.

In an alternative process, the coil need not be removed from the applicator assembly. The entire assembly, with a little care, can be cleaned while remaining assembled. In such cases the washes are done with the tube being stoppered such that the interior is not exposed to the coil cleaning solution.

Again, as pointed out above, the coil need not be removed from the applicator assembly for tube cleaning. The entire assembly, with a little care, can be cleaned while remaining assembled and the coil not exposed to the chemistries of at least the acidic wash, the alkaline wash, and the ammonia peroxide wash.

The inventors point out that among the advantageous features of the invention is the use of TMAH solutions to remove the accumulated aluminum fluoride residues ($AlF_x$). Such is one surprising result obtained when a solution ordinarily used for photoresist development is applied to an applicator cleaning process. The inventors also point out that the process operations of the invention need not be carried out in any specific order and the order of processes can be altered according to the need of the user.

The present invention has been particularly shown and described with respect to certain described embodiments and specific features thereof. However, it should be noted that the above-described embodiments are intended to illustrate the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated by the inventors that different wash solutions may be employed to accomplish the principles of the invention. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

We claim:

1. A method of cleaning a sapphire microwave plasma applicator tube, the method comprising:
   preparing a sapphire microwave plasma applicator tube for cleaning;
   performing a first set of cleanings of the sapphire plasma applicator tube, the first set of cleanings including,
      a first wash to remove organic contaminants from the tube,
      a second wash with water to remove water soluble contaminants, and
      a third wash using an ammonia and peroxide containing solution to remove contaminants from the tube;
   performing a second set of cleanings of the plasma applicator tube, these including,
      a fourth wash with an alkaline cleaning solution to remove $AlF_x$ contaminants from the tube, the fourth wash being performed for at least 60 minutes at a temperature of about 80° C. or greater, the x being any integer, wherein the alkaline cleaning solution contains tetramethyl ammonium hydroxide (TMAH); and
      a fifth wash with an acidic cleaning solution to remove selected metal contaminants from the tube, the fifth wash being performed after the fourth wash, the acidic cleaning solution including hydrofluoric acid, nitric acid and water, the wash being performed for at least 10 minutes at a temperature of about 80° C. or greater.

2. A method of cleaning a microwave applicator tube as in claim 1 wherein wash operations are performed on the tube by sealing wash solutions inside the tube and performing associated wash steps to thereby selectively clean only the inside of the tube.

3. The method of claim 1, wherein said performing of the first wash to remove organic contaminants from the tube is performed using a wash solution containing an organic solvent.

4. The method of claim 1, wherein said second wash is performed with ultrapure water to remove water soluble contaminants, wherein the ultrapure water has a temperature of about 50° C. or greater.

5. The method of claim 1, wherein the alkaline cleaning solution of the fourth wash comprises about 2.5-10.0 weight percent of tetramethyl ammonium hydroxide in water.

6. The method of claim 1, wherein the fifth wash is performed at a temperature of at least about 85° C. for a time in the range of about 10 minutes to about 30 minutes.

7. The method of claim 1, wherein said fifth wash with the acidic cleaning solution enables the removal of Al, Ca, Mg, Ti, Cr, Ni, Li, Na, K, Zn, Mo, Mn, and Fe from the tube.

8. The method of claim 1, wherein said fifth wash with the acidic cleaning solution enables the removal of Cu, Si, and silicon oxides from the tube.

9. The method of claim 1, wherein said fifth wash with the acidic cleaning solution enables the removal of $Al_xF_yO_z$ from the tube, wherein each of x, y and z is any integer.

10. The method of claim 1, wherein a sonicating wash is performed in ultrapure water and is performed after the first, second, third, fourth and fifth washes and wherein the sonicating wash is performed in a sonication bath using a sonication energy in the range of about 10 W/in2 (Watts per square inch) to about 20 W/in2.

11. The method of claim 1, wherein the third wash uses an aqueous solution including ammonia ($NH_4OH$) and hydrogen peroxide ($H_2O_2$).

12. The method of claim 1, wherein the third wash facilitates the removal of $TiF_x$ contaminants from the tube.

13. The method of claim 1, further including drying a clean tube.

14. A method as in claim 1, wherein preparing the microwave applicator tube includes providing an applicator having a sapphire microwave applicator tube encased in a copper RF coil.

15. The method of claim 2, wherein:
   the sapphire microwave plasma applicator tube has an interior surface and an exterior surface that is covered at least partially with a copper coil; and
   the sealing of the wash solutions inside the tube includes using a silicon rubber seal, thereby cleaning the interior surface of the tube without damaging the copper coil.

16. The method of claim 3, wherein said first wash is performed using a wash solution containing an organic solvent selected from at least one of isopropyl alcohol, acetone, methyl ethyl ketone.

17. The method of claim 3, wherein said first wash is performed by soaking the tube for in the range of about 10 to 25 minutes in a wash solution containing isopropyl alcohol.

18. The method of claim 4, wherein the ultrapure water of the second wash has a purity level such that the ultrapure water has a resistivity of at least about 16 MΩ/cm (megaohms per centimeter).

19. The method of claim 10, wherein the sonicating wash is performed at a temperature of at least about 25° C. for at least about 5 minutes.

20. The method of claim 11, wherein the third wash is performed for a time of at least about 20 minutes.

21. A method as in claim 14, wherein preparing the microwave applicator includes,
   removing the sapphire microwave applicator tube from the encasing copper RF coil;
   performing the washes of the tube using the first set of cleanings and the second set of cleanings after its removal from the coil; and
   further comprising performing a coil cleaning step in an acidic solution.

22. The method of claim 14, wherein the coil is cleaned using an acidic solution to remove contaminants from the coil.

23. The method of claim 18, wherein the second wash is performed with the ultrapure water at a temperature in the range of about 50° C. to about 80° C. for a duration of about 5 minutes to 20 minutes.

24. The method of claim 21, wherein said coil cleaning step uses an acidic solution to remove contaminants from the coil.

25. The method of claim 21, wherein the coil cleaning step has a duration of less than about 15 seconds followed by rinsing with ultrapure water.

26. The method of claim 24, wherein the acidic solution of the coil cleaning step comprises a hydrochloric acid solution.

27. The method of claim 24, wherein the acidic solution of the coil cleaning step comprises a solution including nitric acid.

28. The method of claim 27, wherein the acidic solution comprises an aqueous nitric acid solution having a weight percentage in the range of about 2.5 to 5.0 percent.

* * * * *